(12) United States Patent
Chen et al.

(10) Patent No.: US 11,502,176 B2
(45) Date of Patent: Nov. 15, 2022

(54) SEMICONDUCTOR DEVICE WITH FERROELECTRIC ALUMINUM NITRIDE

(71) Applicants: Taiwan Semiconductor Manufacturing Co., Ltd., Hsinchu (TW); National Taiwan University, Taipei (TW)

(72) Inventors: Miin-Jang Chen, Hsinchu (TW); Tzong-Lin Jay Shieh, Hsinchu (TW); Bo-Ting Lin, Hsinchu (TW)

(73) Assignees: Taiwan Semiconductor Manufacturing Co., Ltd., Hsinchu (TW); National Taiwan University, Taipei (TW)

( * ) Notice: Subject to any disclaimer, the term of this patent is extended or adjusted under 35 U.S.C. 154(b) by 23 days.

(21) Appl. No.: 17/088,461

(22) Filed: Nov. 3, 2020

(65) Prior Publication Data
US 2021/0074817 A1    Mar. 11, 2021

Related U.S. Application Data

(62) Division of application No. 16/235,997, filed on Dec. 28, 2018, now Pat. No. 10,847,623.

(60) Provisional application No. 62/736,954, filed on Sep. 26, 2018.

(51) Int. Cl.
*H01L 29/20* (2006.01)
*H01L 29/51* (2006.01)
*H01L 29/778* (2006.01)
*H01L 29/423* (2006.01)
*H01L 21/02* (2006.01)
*H01L 29/66* (2006.01)
*H01L 21/28* (2006.01)

(52) U.S. Cl.
CPC .... *H01L 29/2003* (2013.01); *H01L 21/02458* (2013.01); *H01L 29/40111* (2019.08); *H01L 29/42356* (2013.01); *H01L 29/516* (2013.01); *H01L 29/66462* (2013.01); *H01L 29/778* (2013.01)

(58) Field of Classification Search
CPC .......... H01L 29/2003; H01L 29/40111; H01L 29/42356; H01L 29/516; H01L 29/66462; H01L 29/778; H01L 21/02458
USPC ....................................................... 257/295
See application file for complete search history.

(56) References Cited

U.S. PATENT DOCUMENTS

| | | |
|---|---|---|
| 2013/0026489 A1 | 1/2013 | Gambin et al. |
| 2019/0348532 A1 | 11/2019 | Romanczyk et al. |

*Primary Examiner* — Tu-Tu V Ho
(74) *Attorney, Agent, or Firm* — Seep IP Law Group LLP

(57) ABSTRACT

Techniques in accordance with embodiments described herein are directed to semiconductor devices including a layer of aluminum nitride AlN or aluminum gallium nitride AlGaN as a ferroelectric layer and a method of making a thin film of AlN/AlGaN that possesses ferroelectric properties. In a ferroelectric transistor, a thin film of AlN/AlGaN that exhibits ferroelectric properties is formed between a gate electrode and a second semiconductor layer, e.g., of GaN.

20 Claims, 12 Drawing Sheets

SEMICONDUCTOR DEVICE WITH FERROELECTRIC ALUMINUM NITRIDE

BACKGROUND

A ferroelectric material includes a spontaneous electric polarization that can be reversed by changing an electrical field applied to the ferroelectric material. Ferroelectric materials have been used in devices in gate structures of a transistor or in capacitors. Conventional ferroelectric materials include lead zirconium titanate $Pb(Zr_x, Ti_{1-x})O_3$ (PZT), hafnium dioxide ($HfO_2$), zirconium dioxide ($ZrO_2$), hafnium zirconium oxide ($Hf_xZr_{1-x}O_2$ or HZO), and ferroelectric polymers, such as polyvinylidene fluoride (PVDF).

An AlGaN/GaN heterostructure is considered to be a desirable semiconductor heterostructure since the two-dimensional electron gas (2DEG) interface region thereof has a high electron sheet concentration and low sheet resistance. The GaN structure also includes other desirable properties such as temperature and chemical stability. Conventionally, AlGaN, GaN, and AlN are formed with spontaneous and piezoelectric polarizations that cannot be reversed.

BRIEF DESCRIPTION OF THE SEVERAL VIEWS OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

DETAILED DESCRIPTION

Figure 1A:
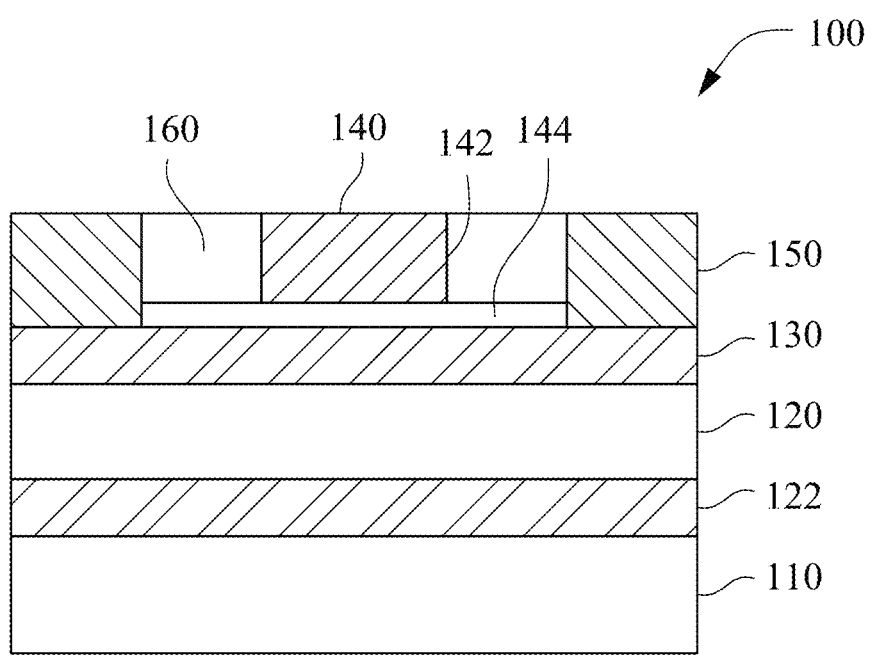
FIG. 1A illustrates an example structure with ferroelectric AlN layer.

Techniques in accordance with embodiments described herein are directed to semiconductor devices including an aluminum nitride AlN or aluminum gallium nitride AlGaN layer as a ferroelectric layer and a method of making a thin film of AlN or AlGaN that possesses ferroelectric properties. In a ferroelectric transistor, a thin film of AlN or AlGaN that exhibits ferroelectric properties is formed between a gate electrode and a second semiconductor layer, e.g., of GaN. When formed, the polarization within the AlN (or AlGaN) film is directed to the underlying GaN layer in the example scenario that the GaN is grown with Ga-face polarity. As such, a two-dimensional electron gas region (2DEG) is formed in the interface between the AlN (or AlGaN) and the GaN, which enables high speed electronic charge carrier movement within the AlN (or AlGaN)/GaN heterojunction region in the switch-on state. In the switch-off state, the polarization of the AlN (or AlGaN) is reversed to be away from the GaN, which facilitates the depletion of the 2DEG region and improves the turn-off characteristics because the 2DEG region is depleted faster.

A capacitor/inductor device includes a thin film of AlN or AlGaN formed over a GaN base. A first electrode, e.g., a platinum electrode, is formed over the AlN or AlGaN film. A second electrode, e.g., of platinum or indium, is formed over the AlN or AlGaN film and is spaced apart from the first electrode or formed through the AlN or AlGaN film and contacting the GaN buffer layer. The reversible polarization in the AlN or AlGaN thin film achieves the negative capacitance effect and/or inductance effects, which are beneficial in application scenarios like bandwidth improvement, band-pass filtering, phase shifter, or impedance matching, etc.

Further, the ferroelectric AlN or AlGaN may be used in ferroelectric memory cells in the 1T-1C memory cell structure or the 1T ferroelectric memory cell structure.

The ferroelectric properties of the AlN or AlGaN thin film is achieved through at least one of an improved crystallization of the AlN or AlGaN thin film and a tensile stress applied to the AlN or AlGaN thin film through the different crystalline structure of the underlying GaN layer, i.e., lattice mismatch. The lattice mismatch between the GaN and the AlN are utilized to achieve the ferroelectric multi-domains within the AlN layer. For example, the interatomic distance between the Ga atom and the N atom in the GaN is larger than the interatomic distance between the Al atom and the N atom in the AlN. As a consequence, a tensile stress tends to pull an Al atom away from some of the adjacent N atoms and closer to others of the adjacent N atoms. Also two adjacent Al atoms are pulled toward different directions.

In this disclosure, the GaN in the AlGaN film are unintentional. The AlN or AlGaN layer is referred to as "$Al_{1-x}Ga_xN$" layer for convenience, where $0 \leq x < 0.4$ and preferably, $0 \leq x < 0.1$.

To ensure that the tensile stress effectively contributes to the ferroelectric properties of the $Al_{1-x}Ga_xN$ film, the thickness of the $Al_{1-x}Ga_xN$ film is controlled to be sufficiently thin, e.g., no more than 25 nm. In an embodiment, the $Al_{1-x}Ga_xN$ film has a thickness ranging from about 1 nm to about 20 nm to ensure that the $Al_{1-x}Ga_xNN$ film includes ferroelectric properties.

Further, a new growth process of the $Al_{1-x}Ga_xN$ film further improves the crystallinity of the $Al_{1-x}Ga_xN$ by adding a layer-by-layer atomic layer annealing process. Specifically, an argon plasma process is added to each reaction cycle of forming a single crystal layer (monolayer) of $Al_{1-x}Ga_xN$ molecules. The argon plasma process further removes the incompletely reacted nitrogen source and/or the aluminum source precursors and cleans up the non-uniform nucleation of $Al_{1-x}Ga_xN$.

The disclosure herein provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The following description refers to example transistors as an examples of a semiconductor structure to which the present description applies; however, the present description is not limited in applicability to transistors or the specific transistor structures. For example, the follow description applies to other types of semiconductor structures that are not transistors where the improved switch-off characteristics are desirable through a fast depletion of a 2DEG region between $Al_{1-x}Ga_xN$ and GaN (or other group-III nitride).

FIG. 1 illustrates an example structure 100. Referring to FIG. 1, structure 100 includes a substrate 110, a first compound semiconductor layer 120 of a first III-V compound semiconductor, e.g., GaN, over the substrate 110, a second compound semiconductor layer 130 of a second III-V compound semiconductor material containing aluminum nitride $Al_{1-x}Ga_xN$ over the first compound semiconductor layer 120, a gate structure 140 over the second compound semiconductor layer 130, and source/drain structures 150 over the second compound semiconductor layers 130 and separated from the gate structure 140 by a dielectric layer 160.

In an embodiment, the gate structure 140 includes a gate electrode 142 and a dielectric layer 144.

In an embodiment, a third compound semiconductor layer 122 of III-V compound semiconductor is formed between the first compound semiconductor layer 120 and the substrate 110 to improve the nucleation of the first compound semiconductor layer 120. The third compound semiconductor layer 122 is often referred to as a "nucleation layer".

The III-V compound semiconductors are compounds of group III elements (e.g., Al, Ga, In) and group V elements (e.g., N, P, As, Sb). For example, the III-V compounds include GaAs, InP, GaP and GaN, AlN, InN. In an embodiment, the first III-V compound material of the first compound semiconductor layer 120 is a first group III nitride, e.g., GaN, InN. A group III nitride is a compound of a group III element and a nitrogen element N. The compound semiconductor material of the second compound semiconductor layer 130 includes AlN. The third compound semiconductor layer 122 is an III-V compound different from that of the first compound semiconductor layer 120. For example, in an embodiment where the first compound semiconductor layer 120 is GaN, the third compound semiconductor layer 122 is AlN. In an embodiment where the first compound semiconductor layer 120 is InN, the third compound semiconductor layer 122 is GaN.

In the description herein, as an illustrative example, the first compound semiconductor layer 120 is GaN "GaN layer 120", the second compound semiconductor layer is AlN or a mixture of AlN with some small amount of GaN, i.e., $Al_{1-x}Ga_xN$, referred to as "$Al_{1-x}Ga_xN$ layer 130", and the third compound semiconductor layer 122 is AlN. As used herein with $Al_{1-x}Ga_xN$, x refers to the ratio of Ga atoms among the total amount of Al and Ga atoms in the mixture of AlN and GaN molecules of $Al_{1-x}Ga_xN$. It should be appreciated that the third compound semiconductor layer 122 is optional as a nucleation. In an embodiment, the second compound semiconductor layer is intended to be AlN and contains unintentional GaN as unavoidable impurities. In the description herein, an $Al_{1-x}Ga_xN$ 130 is used to refer to the second compound semiconductor layer 130, which is meant to cover the scenario where the Ga component is zero in the $Al_{1-x}Ga_xN$, i.e., x=0.

The substrate 110 may be a silicon substrate in a crystalline structure, e.g., the Si(111) or Si(001) crystalline structures, and/or other elementary semiconductors like germanium. Alternatively or additionally, the substrate 110 may include a compound semiconductor such as silicon carbide, gallium arsenide, indium arsenide, sapphire, and/or indium phosphide. Further, the substrate 110 may also include a silicon-on-insulator (SOI) structure. The substrate 110 may include an epitaxial layer and/or may be strained for performance enhancement. The substrate 110 may also include various doping configurations depending on design requirements, as is known in the art, such as P-type substrate and/or N-type substrate and various doped regions such as P-wells and/or N-wells.

The gate structure 140 is a metal gate. The following description lists examples of materials for the gate structure 140. The gate electrode 142 of the gate structure 140 includes a conductive material, e.g., a metal or a metal compound. Suitable metal materials for the gate electrode 142 of the gate structure 140 include ruthenium, palladium, platinum, tungsten, cobalt, nickel, and/or conductive metal oxides and other suitable P-type metal materials and include hafnium (Hf), zirconium (Zr), titanium (Ti), tantalum (Ta), aluminum (Al), aluminides and/or conductive metal carbides (e.g., hafnium carbide, zirconium carbide, titanium carbide, and aluminum carbide), and other suitable materials for N-type metal materials. In some examples, the gate electrode 142 of the gate structures 140 includes a work function layer tuned to have a proper work function for enhanced performance of the field effect transistor devices. For example, suitable N-type work function metals include Ta, TiAl, TiAlN, TaCN, other N-type work function metals, or a combination thereof and suitable P-type work function metal materials include TiN, TaN, other P-type work function metals, or combination thereof. In some examples, a conductive layer, such as an aluminum layer, a copper layer, a cobalt layer or a tungsten layer is formed over the work function layer such that the gate electrode 142 of gate structure 140 includes a work function layer disposed over the dielectric layer 144 and a conductive layer disposed over the work function layer and below a gate cap (not shown for simplicity). In an example, the gate electrode 142 of the gate structure 140 has a thickness ranging from about 5 nm to about 40 nm depending on design requirements.

In example embodiments, the dielectric layer 144 includes an interfacial silicon oxide layer (not separately shown for simplicity), e.g., a thermal or chemical oxide having a thickness ranging from about 5 to about 10 angstrom (A). In example embodiments, the dielectric layer 144 further includes a high dielectric constant (high-K) dielectric material selected from one or more of hafnium oxide ($HfO_2$), hafnium silicon oxide (HfSiO), hafnium silicon oxynitride (HfSiON), hafnium tantalum oxide (HMO), hafnium titanium oxide (HMO), hafnium zirconium oxide (HfZrO), combinations thereof, and/or other suitable materials. A high K dielectric material, in some applications, includes a dielectric constant (K) value larger than 6. Depending on design requirements, a dielectric material of a dielectric constant (K) value of 7 or higher is used. The high-K dielectric layer may be formed by atomic layer deposition (ALD) or other suitable technique. In accordance with embodiments described herein, the high-K dielectric layer of the gate dielectric layer includes a thickness ranging from about 10 to about 30 angstrom (A) or other suitable thickness. Other dielectric materials can also be used for the dielectric layer 144, e.g., MgCaO or $Al_2O_3$.

In other embodiments, there is no dielectric layer 144 between gate electrode 142 and the $Al_{1-x}Ga_xN$ layer 130.

In example embodiments, the inter-layer dielectric layer 160 is silicon oxide or a low-K dielectric material. A low-K dielectric material includes as silicon oxynitride, silicon nitride ($Si_3N_4$), silicon monoxide (SiO), silicon oxycarbide (SiOC), vacuum, and other dielectrics or other suitable materials.

The thickness of the GaN layer 120 is selected based on device design and structural strength considerations, e.g., aspect ratio. In an embodiment, the thickness of the GaN layer 120 is within a range of about 20 nm to about 10 μm.

The nucleation layer 122 may include a thickness between 2 to 8 nm.

The $Al_{1-x}Ga_xN$ layer 130 contains mainly AlN as compared to GaN. In an embodiment, the x is within a range of $0 \leq x \leq 0.4$ for the $Al_{1-x}Ga_xN$. In an embodiment, the $Al_{1-x}Ga_xN$ layer 130 is formed to be an AlN layer and the GaN components are unintentional byproducts generated in the course of forming the AlN film over the GaN layer 120. The $Al_{1-x}Ga_xN$ layer 130 includes a thickness between about 1 nm to about 20 nm. This thickness range is important because such a thin film is preferred for the $Al_{1-x}Ga_xN$ layer 130 to include the crystalline deformation through a tensile stress applied by the GaN layer 120. Such crystalline deformation enhances the ferroelectric properties of the $Al_{1-x}Ga_xN$ layer 130. Specifically, an Al atom in the $Al_{1-x}Ga_xN$ layer 130 is pulled away from some of the adjacent N atoms and closer to other adjacent N atoms. Two adjacent Al atoms are pulled toward different directions. As such, the AlGaN material includes multi-domains of ferroelectric ion clusters, which enables the polarization of the $Al_{1-x}Ga_xN$ layer 130 to be reversed through different external electrical fields applied through the gate structure 140.

FIG. 1A shows the effects of thickness on the ferroelectric properties of the $Al_{1-x}Ga_xN$ layer 130. As shown in FIG. 1A, for a thickness of 10 nm, a symmetric P-V hysteresis loop with significant ferroelectric switching characteristics and saturation regions are clearly observed, indicating the ferroelectricity in the $Al_{1-x}Ga_xN$ layer 130. The remanent polarization (Pr) and the coercive voltage (Vc) of the nanoscale $Al_{1-x}Ga_xN$ layer 130 layer are 1.5 μC/cm2 and 3.4 V, respectively. Two obvious switching current peaks appear in the I-V, further confirming the ferroelectric polarization switching properties of the $Al_{1-x}Ga_xN$ layer 130. Note that the two steep-slope regions of the P-V hysteresis loop indicate the soft switching characteristics, revealing that the electric polarization could easily be fully switched. On the other hand, for a thickness of 25 nm, the P-V and I-V curves exhibit planar-type configurations, indicating a paraelectric characteristic without ferroelectricity. That is, the $Al_{1-x}Ga_xN$ layer 130 will not exhibit ferroelectric properties with the thickness larger than a threshold, e.g., about 20 nm.

Figure 1B:
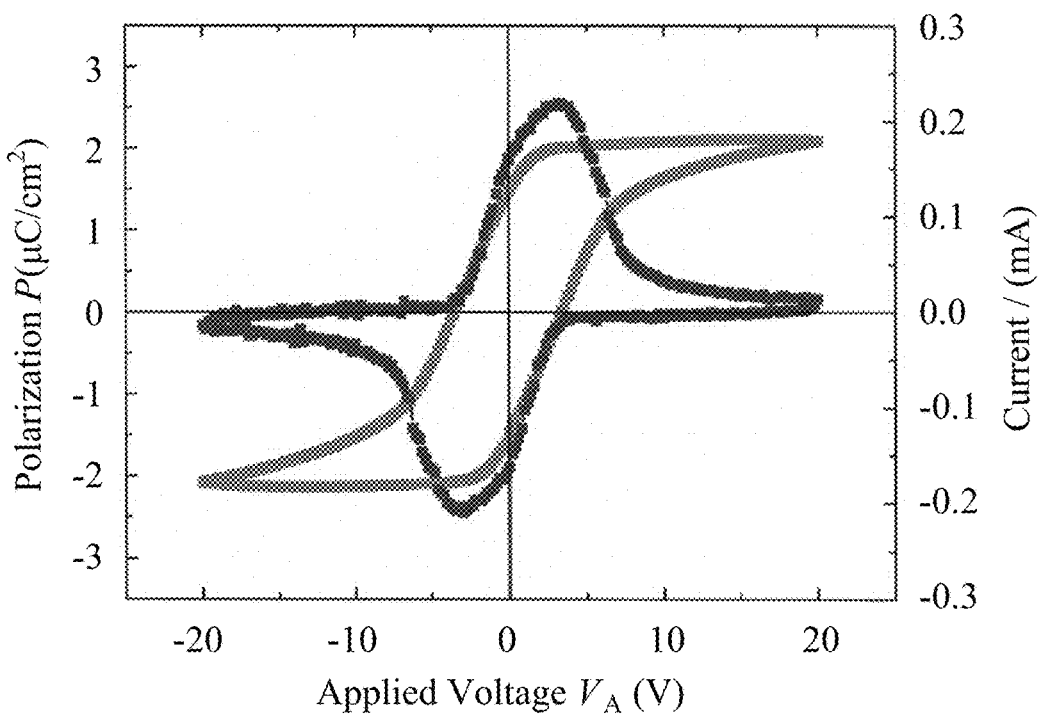
FIGS. 1B and 1C illustrate electrical properties of the structure of FIG. 1A.
Figure 1B:
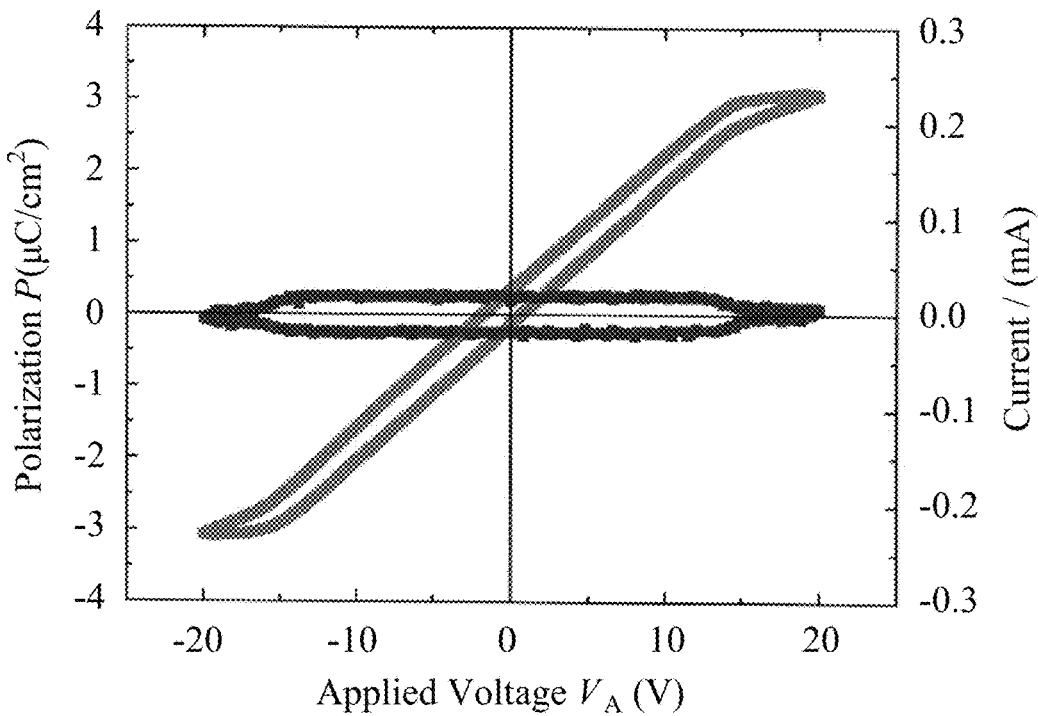

FIG. 1B shows the strain effects on the ferroelectric properties of the $Al_{1-x}Ga_xN$ layer 130. The polarization switching properties of the $Al_{1-x}Ga_xN$ layer 130 is at least partially ascribed to the strain effect at the heterojunction between the $Al_{1-x}Ga_xN$ layer 130 and the GaN 120. The $Al_{1-x}Ga_xN$ layer 130 is subject to the tensile strain due to the greater in-plane lattice constant of GaN than that of AlN within the $Al_{1-x}Ga_xN$ layer 130. FIG. 1B shows the SERS (surface enhanced Raman scattering) spectra of the heterojunction between $Al_{1-x}Ga_xN$ layer 130 and the GaN 120, in which the thickness of the $Al_{1-x}Ga_xN$ layer 130 are 10 and 25 nm, respectively. The Raman shift around 643.8~646.4 cm−1 is associated with the strain-sensitive $E_2$(high) phonon mode. The peak located at 654.2 cm−1 (dashed line) corresponds to strain-free state of the $Al_{1-x}Ga_xN$ layer 130 in $E_2$(high) mode. It is seen that the $E_2$(high) peaks are shifted toward the low-frequency side with respect to the strain-free state, indicating the in-plane tensile strain in the $Al_{1-x}Ga_xN$ layer 130. The shift of $E_2$(high) peak in the 10 nm $Al_{1-x}Ga_xN$ layer 130 is greater than that in the 25 nm $Al_{1-x}Ga_xN$ layer 130, revealing more in-plane tensile strain in the thinner $Al_{1-x}Ga_xN$ layer 130. With the increase of AlN thickness from 10 nm to 25 nm, the $E_2$(high) Raman peak approaches the strain-free state due to strain relaxation in the heterojunction between the $Al_{1-x}Ga_xN$ layer 130 and the GaN layer 120.

In an embodiment, the GaN layer 120 is formed in the Ga-face polarity. The initial polarization, i.e., no external electric field applied, of the $Al_{1-x}Ga_xN$ layer 130 points to the GaN layer in the [0001] axis. In the case that the GaN layer 120 is grown in the N-face polarity, the initial polarization of the $Al_{1-x}Ga_xN$ layer 130 points away from the GaN layer 120 in the [0001] axis. In the description herein, the GaN layer 120 of Ga-face polarity is used as an illustrative example, which does not limit the scope of the disclosure.

Figure 1C:
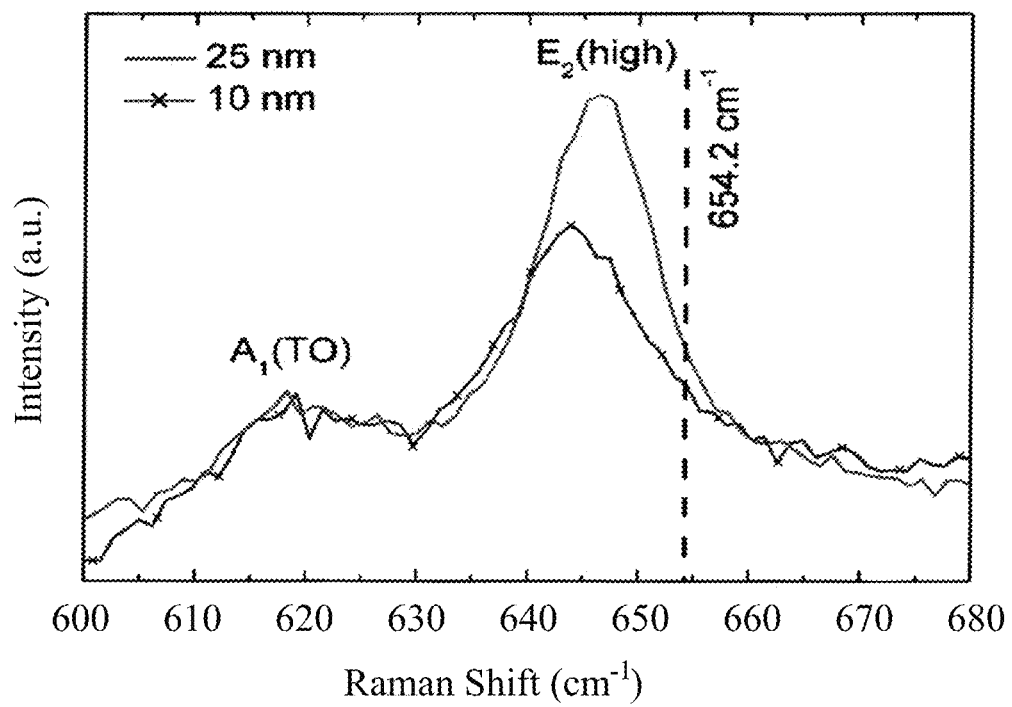
Figure 1D:
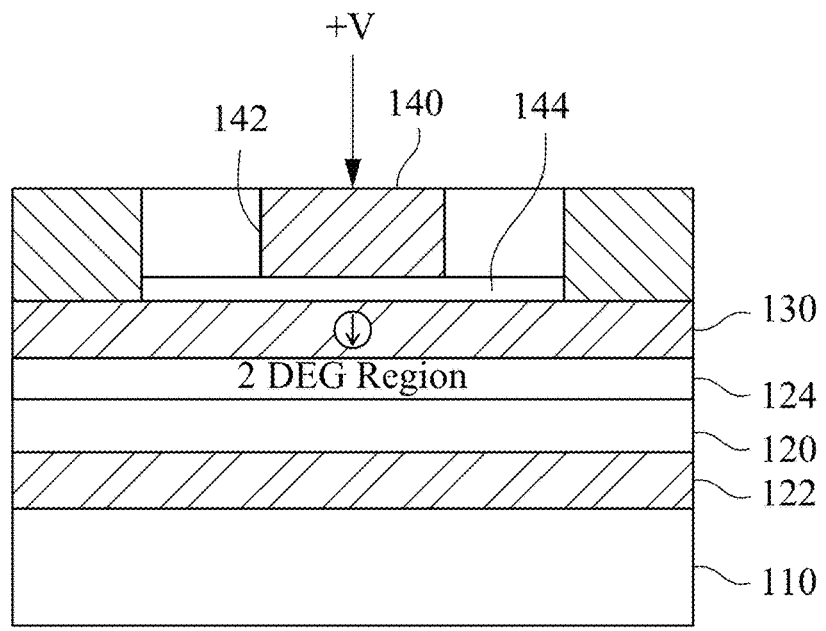
FIGS. 1D and 1E illustrate operation conditions of the structure of FIG. 1A.
Figure 1E:
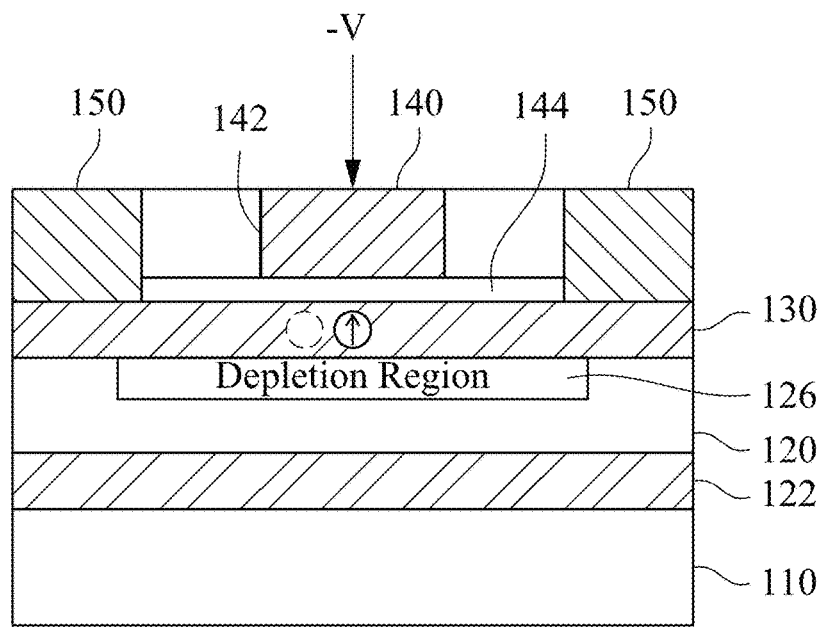

As shown in FIG. 1C, with the $Al_{1-x}Ga_xN$ layer 130 formed over the GaN layer 120, the dominant crystal orientation of the $Al_{1-x}Ga_xN$ layer 130 follows the crystal orientation of the GaN layer 120. When no electrical potential is applied to the $Al_{1-x}Ga_xN$ layer 130, the electric polarization of the $Al_{1-x}Ga_xN$ layer 130 points to the GaN layer 120, as illustrated by the arrow in FIG. 1C, leading to the formation of a 2DEG region in the interface between the $Al_{1-x}Ga_xN$ layer 130 and the GaN layer 120. In a turn-on state, e.g., by a positive voltage applied through the gate structure 140, illustrated as "+V" in FIG. 1C, the electrical polarization of the $Al_{1-x}Ga_xN$ layer 130 remains pointing to the GaN layer 120 and the 2DEG region facilitates high speed charge carrier movements through the tunneling effect. As shown in FIG. 1D, in a turn-off state, e.g., with a negative voltage "−V" applied through the gate structure 140, the electric polarization of the $Al_{1-x}Ga_xN$ layer 130 is reversed, directing away from the GaN layer 120, which facilitates the depletion of the 2DEG region away from the interface between the $Al_{1-x}Ga_xN$ layer 130 and the GaN layer 120.

Figure 2:
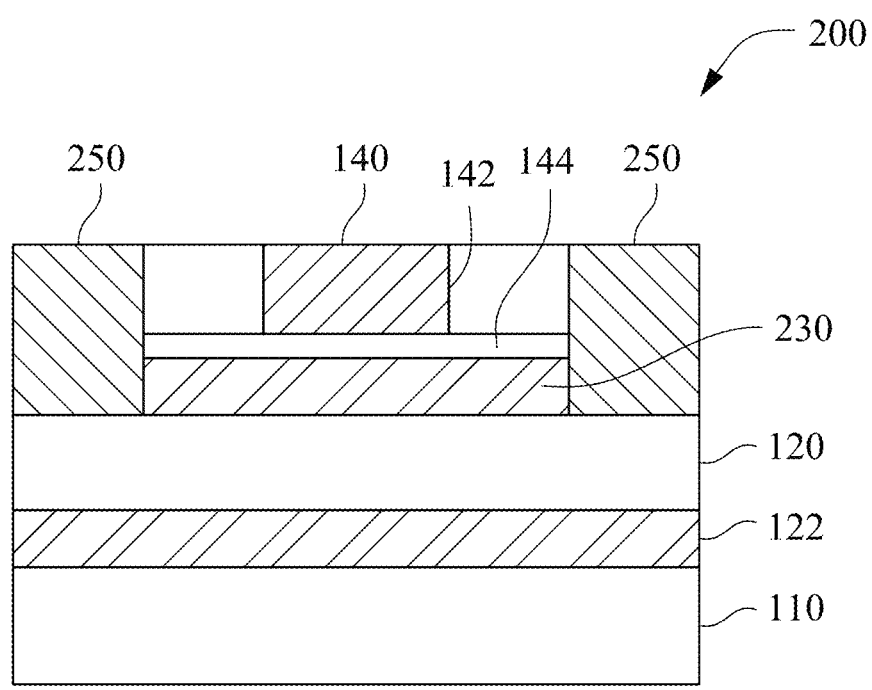
FIGS. 2-4B illustrate various example structures with ferroelectric AlN layer.

Referring to FIG. 2, in an alternative embodiment, example structure 200 includes source/drain structures 250 directly contacting the GaN layer 120. An $Al_{1-x}Ga_xN$ layer 230 is positioned below the gate structure 140 and extends between the two adjacent source/drain structures 250. Similarly to the structure 100 of FIG. 1, in some embodiments, there is no dielectric layer 144 and the gate electrode 142 contacts the $Al_{1-x}Ga_xN$ layer 230 directly.

In an embodiment, the example structures 100, 200 may be configured as metal oxide semiconductor high electron mobility transistors (MOS-HEMT) or high electron mobility transistors (HEMT).

Further the example devices 100, 200 may be used in the 1-T ferroelectric memory cells, where a bit line is connected to a source/drain terminal 150, 250 and a word line is connected to the gate structure 140.

FIG. 3 shows another example structure 300. Referring to FIG. 3, the structure 300 includes a substrate 310, e.g., a silicon or sapphire substrate; a first compound semiconductor layer 320 of a first III-V compound semiconductor, e.g., GaN, over the substrate 310; a second compound semiconductor layer 330 of a second III-V compound semiconductor that contains aluminum nitride AlN over the first compound semiconductor layer 320; and two electrodes 340A, 340B over the second compound semiconductor layer 330 and spaced apart from one another. Optionally, a nucleation layer 322 of a third compound semiconductor material, e.g., AlN, is formed between the substrate 310 and the first compound semiconductor layer 320. The layers 310, 320, 330 and 322 may be similar to the layers 110, 120, 130 and 122 in structure 100.

Various electrically conductive materials may serve as the ohmic contact electrodes 340A, 340B, e.g., gold, silver, platinum, aluminum, or indium. In an embodiment, the electrodes 340A, 340B are platinum.

In an embodiment, the layer 330 is $Al_{1-x}Ga_xN$. The $Al_{1-x}Ga_xN$ layer 330 contains mainly AlN as compared to GaN. In an embodiment, the x is within a range of 0≤x≤0.4 for the $Al_{1-x}Ga_xN$. In an embodiment, the $Al_{1-x}Ga_xN$ layer 330 is formed to be an AlN layer and the GaN components are unintentional byproducts generated in the course of forming the AlN film over the GaN layer 320. The $Al_{1-x}Ga_xN$ layer 330 includes a thickness between about 1 nm to about 20 nm. This thickness range is critical because such a thin film is preferred for the $Al_{1-x}Ga_xN$ layer 330 to include the crystalline structural deformation through a tensile stress applied by the GaN layer 320.

In an embodiment, the semiconductor layer 320, e.g., of GaN, is un-doped.

Figure 3A:
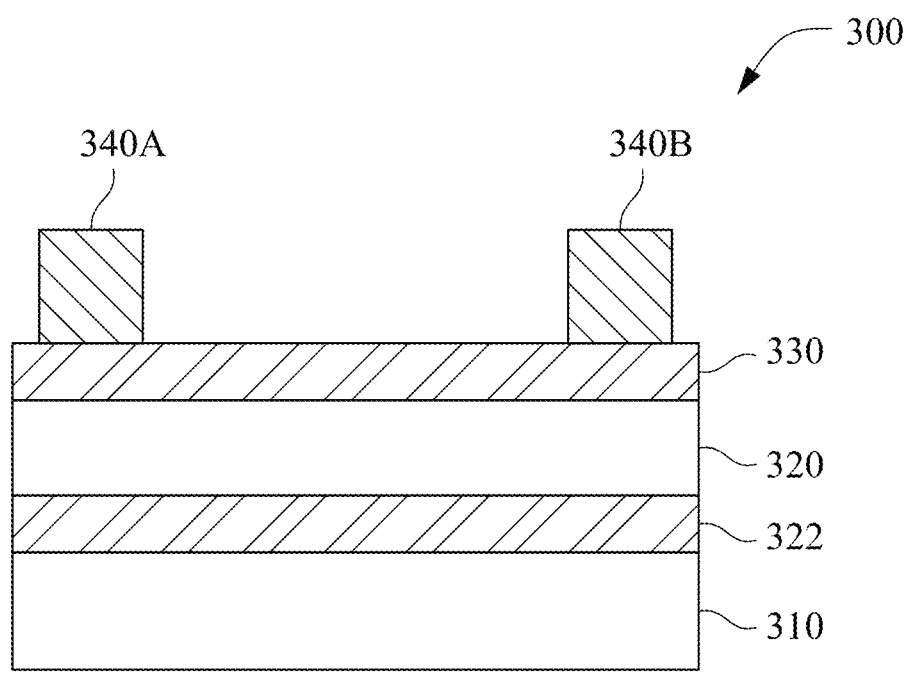

As shown in FIG. 3A, in an initial state, i.e., with no outside electrical field applied, the electric polarization in the whole $Al_{1-x}Ga_xN$ layer 330 is directed toward the GaN layer 320, as illustratively shown by the arrows. In the initial state, a 2DEG region 324 exists in the interface between the $Al_{1-x}Ga_xN$ layer 330 and the GaN layer 320.

Figure 3B:
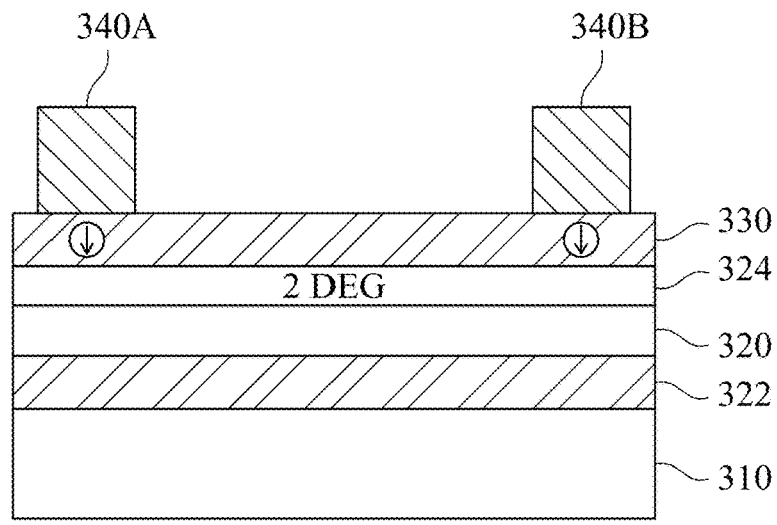

As shown in FIG. 3B, in operation, when a positive outside electrical field is applied through the electrode 340A, i.e., the voltage at the electrode 340A (illustratively shown as +V) is higher than the voltage at the electrode 340B (illustratively shown as ground), the electric polarization of a first part 330A of the $Al_{1-x}Ga_xN$ layer 330 adjacent to the electrode 340A remains pointing to the GaN layer 320 with a 2DEG region 324A formed in the interface. For a second part 330B of the $Al_{1-x}Ga_xN$ layer 330 adjacent to the electrode 340B, the electric polarization is switched in its direction, now pointing away from the GaN layer 320. As such, a depletion region 326B is formed in the interface between the second AlGaN region 330B and the GaN layer 320. Thus, the net electric polarization directs from the electrode 340A to the electrode 340B.

Figure 3C:
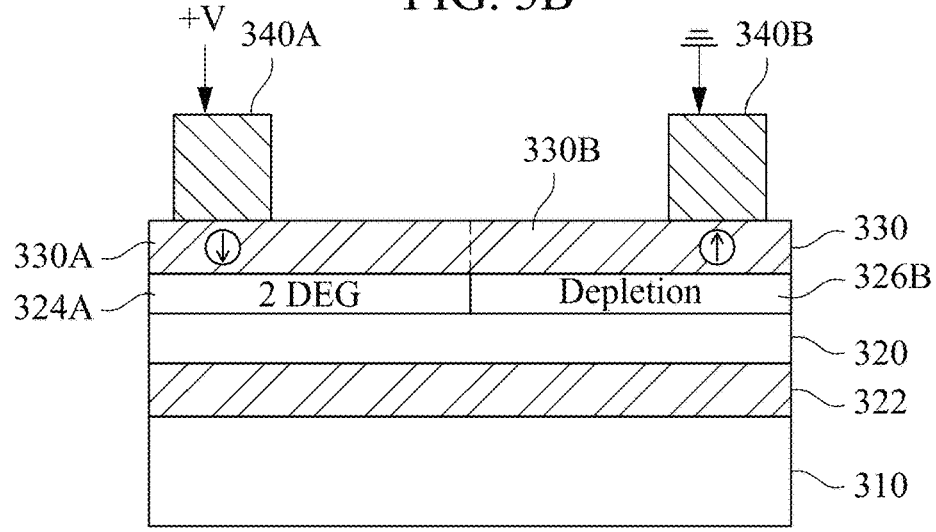

As shown in FIG. 3C, in operation, when a negative outside electrical field is applied through the electrode 340A, i.e., the voltage at electrode 340B (illustratively shown as the ground) is higher than the voltage at electrode 340A (illustratively shown as −V), the electric polarization of the AlGaN region 330B adjacent to the electrode 340B is now pointing to the GaN layer 320 with a 2DEG region 324B formed in the interface. For the AlGaN region 330A adjacent to the electrode 340A, the electric polarization is switched in direction, now pointing away from the GaN layer 320. As such, a depletion region 326A is formed in the interface between the AlGaN region 330A and the GaN layer 320. Thus, the net electric polarization directs from the electrode 340B to the electrode 340A.

As such, the example structure 300 essentially includes two ferroelectric capacitors coupled in series and may be used as a memory cell in a ferroelectric memory or other applications. The net electric polarization, or resistance values, between the electrodes 340A, 340B may be used to indicate the "1" or "0" logic states saved in the memory cell. Further, the structure 300 may also be used as an inductor due to the inductance characteristics of the negative capacitance of a ferroelectric capacitor.

Figure 3D:
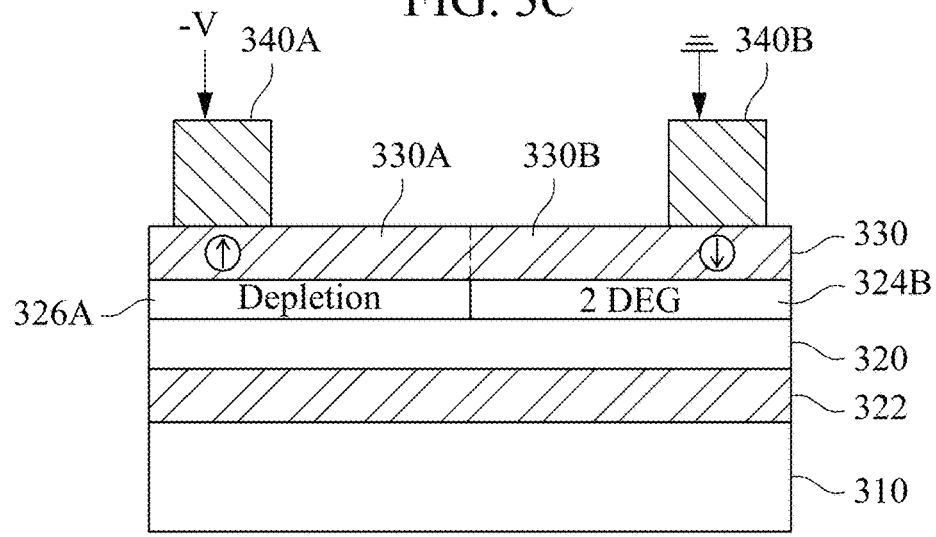
Figure 3E:
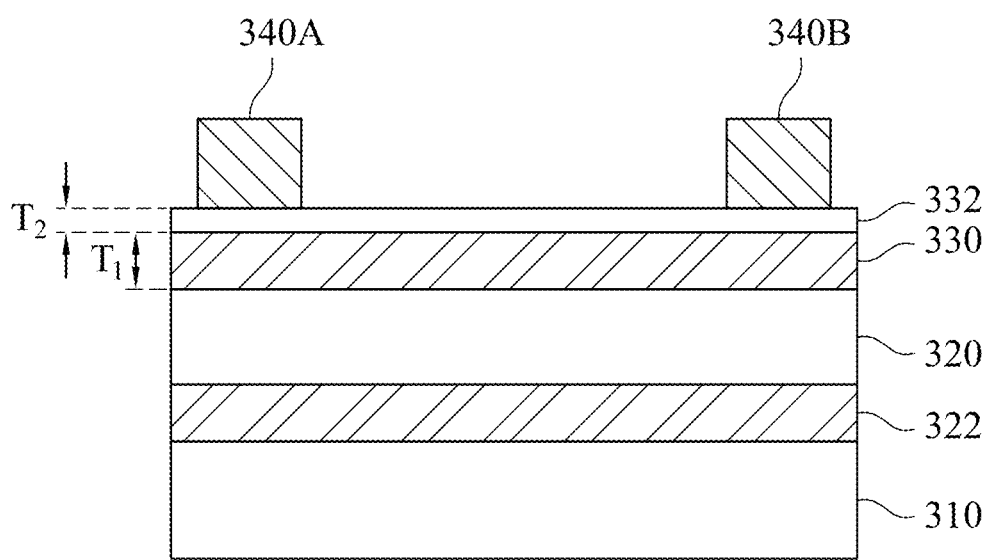

FIG. 3D shows an alternative or additional embodiment to the structure 300 of FIG. 3. Referring to FIG. 3DA, a dielectric layer 332 is positioned between the electrodes 340A or 340B and the $Al_{1-x}Ga_xN$ layer 330. The dielectric layer 332 is one or more of $Al_2O_3$, $HfO_2$, $ZrO_2$ or other suitable dielectric materials. The dielectric layer 332 functions, among others, to reduce the leakage current from the ferroelectric $Al_{1-x}Ga_xN$ layer 330. The leakage current of the $Al_{1-x}Ga_xN$ layer 330 may become more serious in the scenario that the thickness T1 of the ferroelectric $Al_{1-x}Ga_xN$ layer 330 is smaller than about 8 nm. In an embodiment, a thickness T2 of the dielectric layer 332 is within a range between about 2 nm to about 20 nm.

Figure 4A:
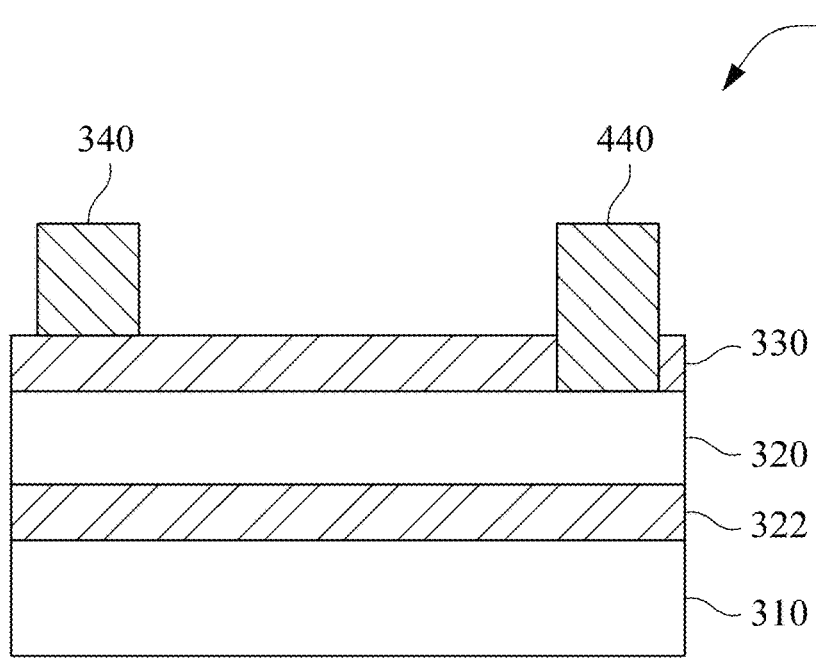
Figure 4B:
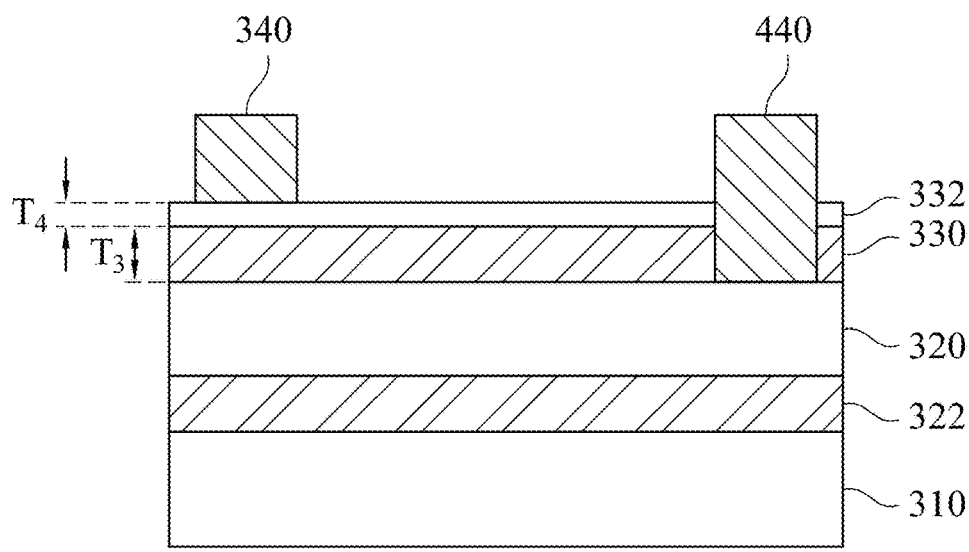

FIG. 4 shows another example structure 400. The structure 400 is similar to the structure 300 except that an electrode 440 extends through the $Al_{1-x}Ga_xN$ layer 330 and contacts the GaN layer 320 directly. As such, the structure 400 essentially embodies a single capacitive device. The electrode 440 may include a same or a different conductive material from that of the electrode 340. For example, in a case where the electrode 340 is Pt, the electrode 440 is indium (In) or other suitable conductive materials.

FIG. 4A shows an alternative or additional embodiment to the structure 400 of FIG. 4. Referring to FIG. 4A, a dielectric layer 332 is positioned between the electrode 340 and the $Al_{1-x}Ga_xN$ layer 330. The dielectric layer 332 is one or more of $Al_2O_3$, $HfO_2$, $ZrO_2$ or other suitable dielectric materials. The dielectric layer 332 functions, among others, to reduce the leakage current from the ferroelectric $Al_{1-x}Ga_xN$ layer 330. The leakage current of the $Al_{1-x}Ga_xN$ layer 330 may become more serious in the scenario that the thickness T3 of the ferroelectric $Al_{1-x}Ga_xN$ layer 330 is smaller than about 8 nm. In an embodiment, a thickness T4 of the dielectric layer 332 is within a range between about 2 nm to about 20 nm. The electrode 440 extends through the dielectric layer 332 and the ferroelectric $Al_{1-x}Ga_xN$ layer 330 and contacts the GaN layer 320 directly. In an embodiment, the GaN layer 320 is un-doped.

In an example application, the ferroelectric structures 300, 400 may be used as a ferroelectric capacitor in a ferroelectric memory cell. For example, in a 1-transistor 1-capacitor arrangement, the ferroelectric structure 300, 400 may be coupled to a source/drain terminal of a transistor. The gate of the transistor may be coupled to be word line and the other source/drain terminal of the transistor may be coupled to a bit line of the memory cell. The reversible polarization direction of the $Al_{1-x}Ga_xN$ layer 330 may affect the resistance value and the current value going through the source/drain terminals, indicating a "1" or "0" logic state stored in the memory cell.

Figure 5:
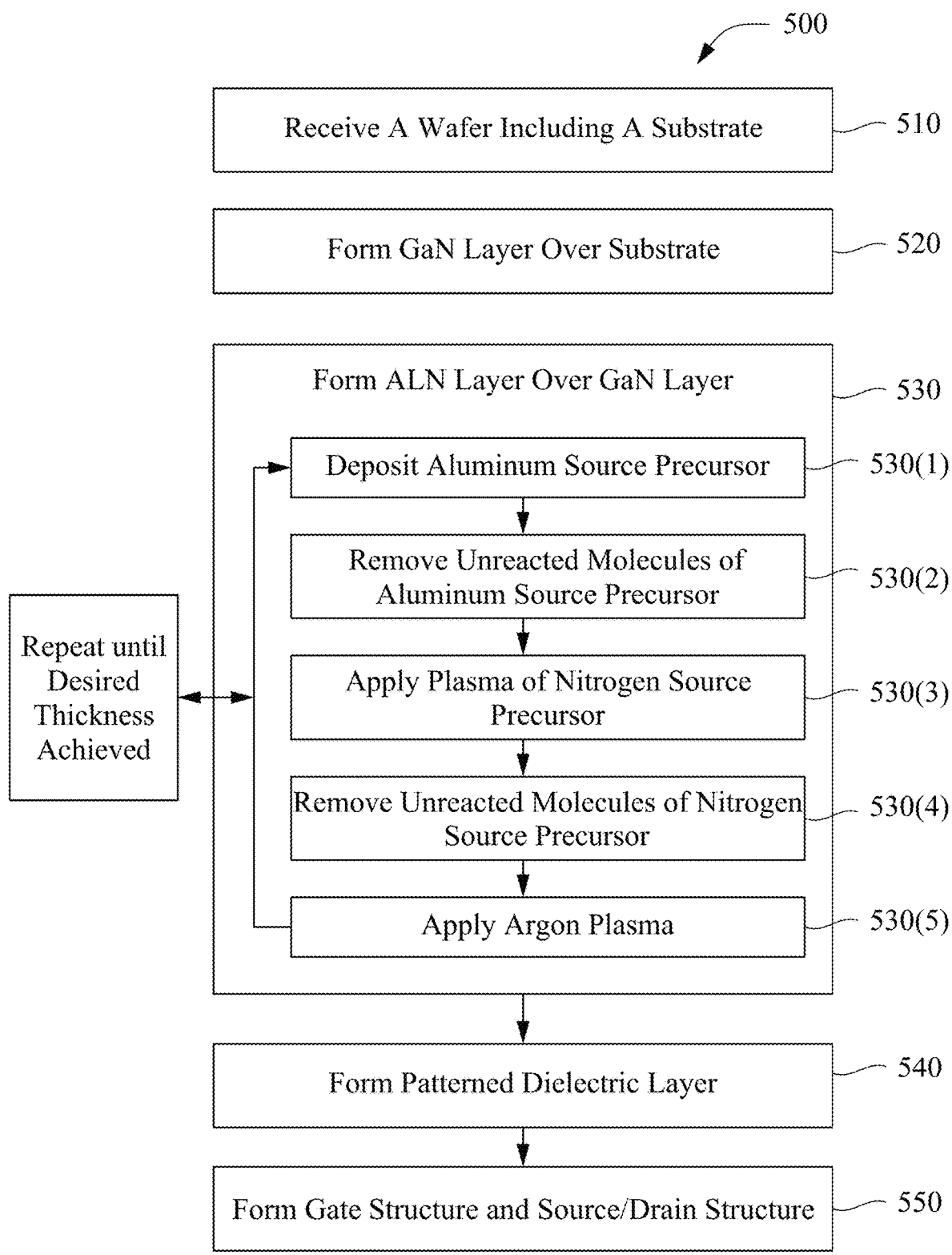
FIG. 5 illustrates an example fabrication process.

FIG. 5 shows an example fabrication process 500, which may be used to make the example structures 100, 200, 300, 400, and other semiconductor structures/devices. FIGS. 6A-6E show an example wafer 600 in various stages of the process 500 in making the example structure 100, as an illustrative example.

Figure 6A:
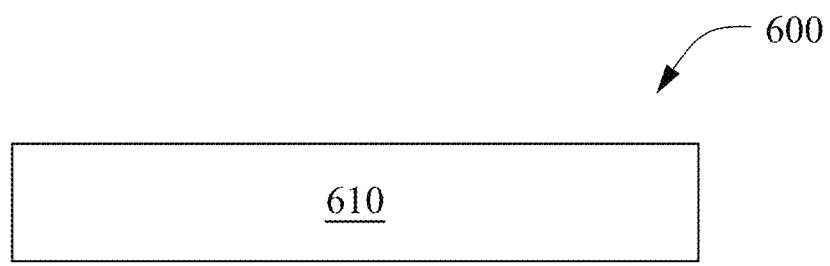
FIGS. 6A-6E illustrate cross-sectional views of an example wafer at various stages of fabrication under the fabrication process of FIG. 5.

With continuous reference to FIG. 5, in example operation 510 a wafer 600 is received. FIG. 6A shows that wafer 600 includes a substrate 610. In an example, the substrate 610 is silicon or sapphire. In an example, optionally, the wafer 600 also includes a nucleation layer of AlN over the substrate 610.

Figure 6B:
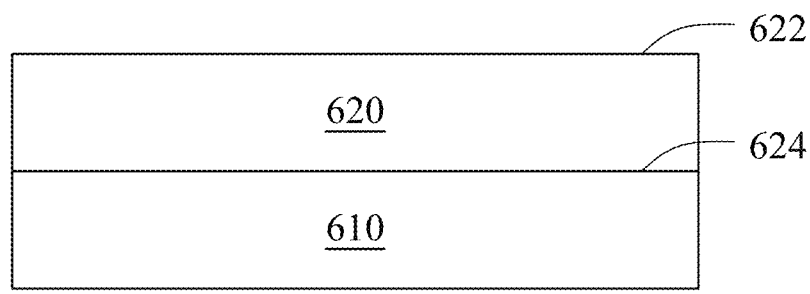

In example operation 520, with reference also to FIG. 6B, a GaN layer 620 may be formed over the substrate 610 (or AlN layer 612) using metalorganic chemical vapor deposition (MOCVD), molecular beam epitaxy (MBE), or other suitable processes. In an embodiment, the GaN layer 620 is formed with a sufficiently large thickness such that the crystalline structure on the upper surface 622 is not affected by a stress applied to its lower surface 624 by the substrate 610 or the nucleation layer over the substrate 610. In an embodiment, the GaN layer 620 includes a thickness ranging from about 20 nm to about 10 μm.

The GaN layer 620 may be intrinsic or may be doped as N-type, e.g., by supply of additional Si or Ge containing precursor, or may be doped as P-type, e.g., by using Mg precursor. Other suitable doping procedures, e.g., ion implantation of Si, Ge impurities for N-type or Mg impurities for P-type, are also possible and included in the disclosure. For illustrative purposes, the GaN layer 620 is intrinsic with or without unintentional doping. For example, the GaN layer 620 may be unintentionally doped as N-type due to nitrogen vacancies.

In an embodiment, the choice of the group III nitride material for the layer 620 is determined based on that the in-plane interatomic distance between a group-III atom and a nitrogen atom on the layer 620 is larger than an in-plane interatomic distance between an aluminum atom and a nitrogen atom in aluminum nitride AlN. GaN meets these example criteria.

Figure 6C:
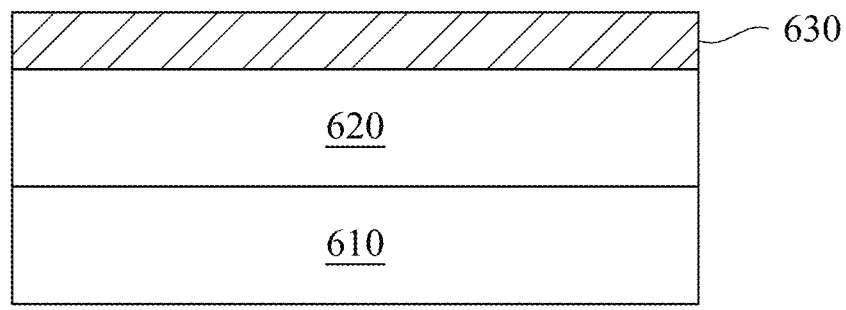

In example operation 530, with reference also to FIG. 6C, an AlN layer 630 is formed over the GaN layer 620. In an embodiment, the AlN layer 630 is formed with a thickness ranging from about 1 nm to about 20 nm. The range of 1 to 20 nm is critical in that such a small thickness ensures that the lattice mismatch force applied to the AlN layer 630 has sufficient tensile stress to achieve or maintain the ferroelectric properties of the AlN layer 630. The AlN layer 630 may contain a small amount of GaN, i.e., $Al_{1-x}Ga_xN$, with $0 \leq x \leq 0.4$. The AlN layer 630 may be formed with plasma enhanced atomic layer deposition (PE-ALD) or other suitable approaches. In an embodiment, the AlN layer 630 is formed in a same facet direction as the GaN layer 620.

Specifically, the operation 530 includes a repeated sequence of sub-operations 530(1)-530(5) of a PE-ALD process. Each cycle of repeated sub-operations 530(1)-530(5) completes a cycle of reactions in forming a single crystal layer, i.e., a monolayer, of AlN. In example sub-operation 530(1), an aluminum source precursor is deposited over the upper surface 622 of the GaN layer 620. The aluminum source precursor is trimethylaluminum (TMA) or aluminum chloride ($AlCl_4$) or other suitable aluminum source precursors. In an embodiment, TMA is used as the aluminum source precursor and is pulsed onto the upper surface 622 for about 20 ms to about 40 ms in a reaction chamber.

In example sub-operation 530(2), the unreacted TMA molecules are removed by purging using inert gas of argon (Ar) or nitrogen ($N_2$). The purging lasts for about 3 seconds to about 10 seconds, with plasma off.

In example sub-operation 530(3), the wafer 600 is exposed to a plasma of a nitrogen source precursor. The nitrogen source precursor is ammonia ($NH_3$) or $N_2+H_2$. For example, an exposure to $NH_3$ is performed for 5 to 60 seconds under a plasma power of 150 to 300 W.

In example sub-operation 530(4), the unreacted nitrogen source precursor molecules are removed by purging using inert gas of Ar or $N_2$, with plasma off. The purging may last for about 3 seconds to about 10 seconds.

In example sub-operation 530(5), an argon Ar plasma is applied to the formed monolayer AlN molecules for a layer-by-layer annealing treatment (ALA). Through this ALA treatment via Ar plasma, the energy is transferred from the incident ions or radicals to the as-deposited monolayer AlN formed by the 530(1)-530(4) sub-operations. The ALA treatment may enhance the atom migration and increase the surface temperature on the surface of the monolayer AlN, which improves the crystallization of the deposited monolayer AlN. In addition, the ALA treatment further removes the ligands of the chemisorbed precursors of the aluminum source or the nitrogen source. Thus, the chemical properties of AlN monolayer surface are modulated by the ALA treatment. As a result, the crystal quality of the AlN layer 630 is greatly enhanced by the ALA treatment of each monolayer AN using argon plasma.

The sub-operations 530(1)-530(5) are repeated until the desired thickness of AlN layer 630 is achieved, which is no more than 20 nm.

The deposition temperature is within a range between about 250° C. to about 400° C.

Figure 6D:
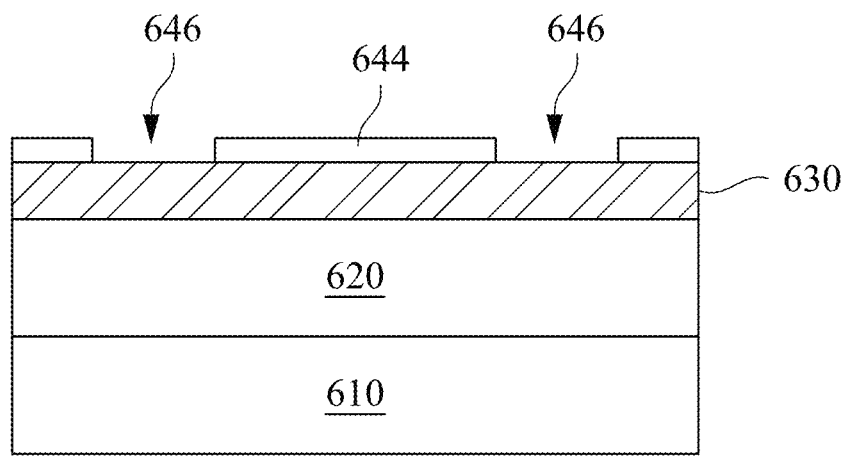

In example operation 540, with reference also to FIG. 6D, a dielectric layer 644 is formed and patterned over the AlN layer 630. In an embodiment, the dielectric layer 644 includes a high-K dielectric material selected from one or more of hafnium oxide ($HfO_2$), hafnium silicon oxide (Hf- SiO), hafnium silicon oxynitride (HfSiON), hafnium tantalum oxide (HfTaO), hafnium titanium oxide (HMO), hafnium zirconium oxide (HfZrO), combinations thereof, and/or other suitable materials $ZrO_2$, $Al_2O_3$, LaO, TiO, $Ta_2O_5$, $Y_2O_3$, STO, BTO, BaZrO, HfZrO, HfLaO.

The high-K dielectric layer 644 may be formed by chemical vapor deposition (CVD) or atomic layer deposition (ALD) or other suitable technique. In accordance with embodiments described herein, high-K dielectric layer 644 includes a thickness ranging from about 5 to about 25 angstrom (A) or other suitable thickness.

The patterning of the dielectric layer 644 exposes the AlN layer 630 through apertures 646.

Figure 6E:
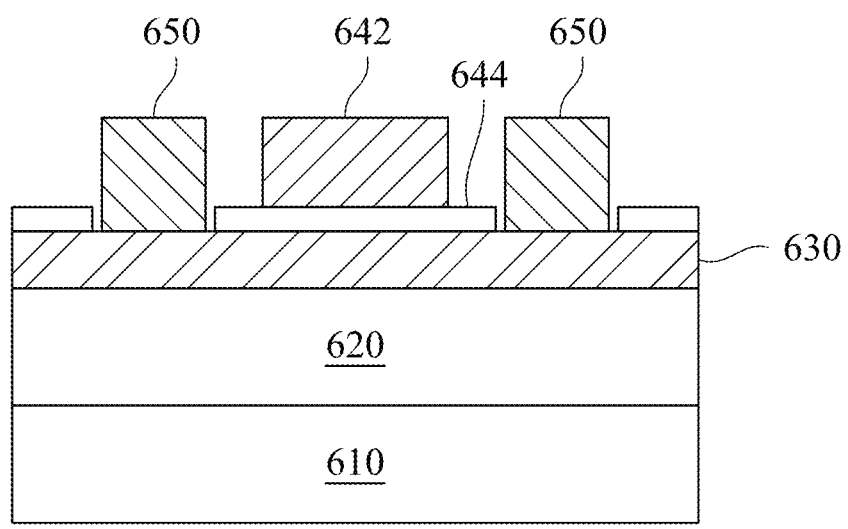

In example operation 550, with reference also to FIG. 6E, source/drain structures 650 are formed over the AlN layer 630, e.g., through the apertures 646, and a gate electrode 642 is formed over the dielectric layer 644 and adjacent to the source/drain structures 650. The gate electrode 642 and the source/drain structures 650 may be made using a same conductive material or may be made from different materials.

A device of an $Al_{1-x}Ga_xN$ (with 0≤x≤0.4) and GaN heterojunction has many advantages including the increased piezoelectric polarization and charges at the interface between the GaN and the AlGaN. The piezoelectric scattering is reduced and the electron mobility through the 2DEG region is enhanced. Further, by forming the $Al_{1-x}Ga_xN$ layer with ferroelectric properties using the techniques of the disclosure, the depletion characteristic of the 2DEG region is improved which makes the related ferroelectric HEMT, MOSHEMT, or ferroelectric capacitor, ferroelectric memory devices more desirable.

The example embodiments described herein are used for illustration purposes and do not limit the scope of the disclosure. For example, the GaN layer may be replaced by other group-III nitride as along as the other group-III nitride has a crystalline lattice that applies a tensile stress on the $Al_{1-x}Ga_xN$ film grown thereupon. For example, the GaN layer may be replaced with InN or InGaN.

The present disclosure may be further appreciated with the description of the following embodiments:

In a structure embodiment, a structure includes a substrate, a layer of GaN over the substrate, a layer of $Al_{1-x}Ga_xN$ directly over the layer of GaN, a gate electrode over the $Al_{1-x}Ga_xN$ layer, and a source/drain structure over the layer of GaN and adjacent to the gate structure. The $Al_{1-x}Ga_xN$ layer has a ferroelectric property.

In another structure embodiment, a structure includes a substrate, a first layer of a first group-III nitride over the substrate, a second layer of a second group-III nitride over the first group-III nitride layer, and a first electrode over the second layer of the second group-III nitride. The second group-III nitride contains AlN and has a ferroelectric property.

In a method embodiment, a layer of a first group-III nitride is formed over a substrate. The first group-III nitride includes a first interatomic distance between a group-III atom and a nitrogen atom. The first interatomic distance is larger than a second interatomic distance between an aluminum atom and a nitrogen atom in aluminum nitride. A layer of aluminum nitride is formed over the layer of the first group-III nitride. The layer of aluminum nitride has a thickness less than 20 nm.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method, comprising:
    forming a layer of a first group-III nitride over a substrate, the first group-III nitride including a first in-plane interatomic distance between a group-III atom and a nitrogen atom, the first in-plane interatomic distance being larger than a second in-plane interatomic distance between an aluminum atom and a nitrogen atom in aluminum nitride; and
    forming a layer of aluminum nitride over the layer of the first group-III nitride and in a same facet direction as the layer of the first group-III nitride, the layer of aluminum nitride having a thickness less than 20 nm.

2. The method of claim 1, wherein the forming the layer of aluminum nitride includes a growth cycle of:
    depositing an aluminum source precursor over the first group-III nitride;
    removing unreacted molecules of the aluminum source precursor;
    applying a plasma of a nitrogen source precursor;
    removing unreacted molecules of the nitrogen source precursor; and
    applying an argon plasma or a helium/argon mixture plasma.

3. A method, comprising:
    forming a layer of a first group-III nitride over a substrate, the first group-III nitride including a first in-plane interatomic distance between a group-III atom and a nitrogen atom, the first in-plane interatomic distance being larger than a second in-plane interatomic distance between an aluminum atom and a nitrogen atom in aluminum nitride; and
    forming a layer of aluminum nitride over the layer of the first group-III nitride, the layer of aluminum nitride having a thickness less than 20 nm,
    wherein the forming the layer of aluminum nitride includes a growth cycle of:
        depositing an aluminum source precursor over the first group-III nitride;
        removing unreacted molecules of the aluminum source precursor;
        applying a plasma of a nitrogen source precursor;
        removing unreacted molecules of the nitrogen source precursor; and
        applying an argon plasma or a helium/argon mixture plasma.

4. A method, comprising:
    forming a layer of GaN over a substrate;
    forming a layer of $Al_{1-x}Ga_xN$ directly over the GaN layer, the $Al_{1-x}Ga_xN$ layer having a ferroelectric property;
    forming a gate electrode over the $Al_{1-x}Ga_xN$ layer; and
    forming a source/drain structure over the GaN layer and adjacent to the gate electrode.

5. The method of claim 4, wherein $0 \leq x \leq 0.4$ in the $Al_{1-x}Ga_xN$ layer.

6. The method of claim 4, wherein the source/drain structure is positioned over the $Al_{1-x}Ga_xN$ layer.

7. The method of claim 4, wherein the $Al_{1-x}Ga_xN$ layer has a thickness ranging from about 1 nm to 20 nm.

8. The method of claim 4, wherein the GaN layer also includes InN.

9. The method of claim 4, wherein the substrate includes sapphire.

10. The method of claim 4, wherein the substrate is silicon, and further comprising forming a nucleation layer between the silicon substrate and the GaN layer.

11. The method of claim 10, wherein the nucleation layer is AlN.

12. A method, comprising:
    forming a first layer of a first group-III nitride over a substrate;
    forming a second layer of a second group-III nitride over the first group-III nitride layer, the second group-III nitride containing AlN and having a ferroelectric property; and
    forming a first electrode over the second layer of the second group-III nitride.

13. The method of claim 12, further comprising forming a second electrode contacting the first layer of the first group-III nitride.

14. The method of claim 13, wherein the first group-III nitride is un-doped GaN and the second group-III nitride is ferroelectric AlGaN having a thickness less than 20 nm.

15. The method of claim 12, further comprising forming a second electrode contacting the second layer of the second group-III nitride and spaced apart from the first electrode.

16. The method of claim 12, further comprising forming a dielectric layer positioned between the first electrode and the second layer of the second group-III nitride.

17. The method of claim 12, wherein the second layer of the second group-III nitride is AlGaN and has a thickness ranging from about 1 nm to about 20 nm.

18. The method of claim 12, wherein the substrate includes sapphire.

19. The method of claim 12, wherein the first layer of the first group-III nitride includes GaN.

20. The method of claim 12, wherein the second group-III nitride is $Al_{1-x}Ga_xN$ with $0 \leq x \leq 0.4$.

* * * * *